United States Patent
Tai et al.

(10) Patent No.: US 8,742,971 B1
(45) Date of Patent: Jun. 3, 2014

(54) SUCCESSIVE APPROXIMATION ANALOG-TO-DIGITAL CONVERTER

(71) Applicant: National Taiwan University, Taipei (TW)

(72) Inventors: Hung-Yen Tai, Taipei (TW); Hung-Wei Chen, Taipei (TW); Hsin-Shu Chen, Taipei (TW)

(73) Assignee: National Taiwan University, Taipei (TW)

(*) Notice: Subject to any disclaimer, the term of this patent is extended or adjusted under 35 U.S.C. 154(b) by 0 days.

(21) Appl. No.: 13/915,022

(22) Filed: Jun. 11, 2013

(30) Foreign Application Priority Data

Nov. 15, 2012 (TW) .............................. 101142627 A (51) Int. Cl.
*H03M 1/34* (2006.01)
*H03M 1/00* (2006.01)
*H03M 1/06* (2006.01)
*H03M 1/12* (2006.01)
*H03M 1/80* (2006.01)

(52) U.S. Cl.
CPC ............... *H03M 1/00* (2013.01); *H03M 1/0695* (2013.01); *H03M 1/12* (2013.01); *H03M 1/804* (2013.01)

USPC ............................................ 341/163; 341/161

(58) Field of Classification Search
CPC ....... H03M 1/00; H03M 1/0695; H03M 1/12; H03M 1/804
USPC .......... 341/163, 161, 164, 165, 156, 155, 172, 341/150
See application file for complete search history.

(56) References Cited

U.S. PATENT DOCUMENTS 7,903,018 B2 * 3/2011 Schatzberger et al. ........ 341/172

* cited by examiner

*Primary Examiner* — Joseph Lauture
(74) *Attorney, Agent, or Firm* — Cesari and McKenna, LLP (57) ABSTRACT

A successive approximation analog-to-digital converter includes: a comparator for comparing first and second comparison voltages from a conversion module and respectively identical to first and second input voltages, which are transmitted to the conversion module via a switch module in an ON state; and a control module for controlling the switch module and the conversion module and generating a digital output that corresponds to a difference between the first and second input voltages based on first and second comparison signals from the comparator and a clock signal. The switch module includes two switch units each having a series connection of first and second switches, and a third switch coupled to a common node between the first and second switches.

5 Claims, 5 Drawing Sheets

SUCCESSIVE APPROXIMATION ANALOG-TO-DIGITAL CONVERTER

CROSS-REFERENCE TO RELATED APPLICATION

This application claims priority of Taiwanese Application No. 101142627, filed on Nov. 15, 2012, the contents of which are hereby incorporated by reference.

BACKGROUND OF THE INVENTION

1. Field of the Invention

This invention relates to an analog-to-digital converter, and more particularly to a successive approximation analog-to-digital converter.

2. Description of the Related Art

Among various types of analog-to-digital converters, a conventional successive approximation analog-to-digital converter can provide better energy efficiency and only dissipates dynamic power, and is therefore suitable for use under circumstances with limited power source. Since dissipation of dynamic power in the conventional successive approximation analog-to-digital converter is directly proportional to the square of its power supply voltage and to its capacitive loads, decreasing the power supply voltage and the capacitive loads can enhance energy efficiency. However, the conventional successive approximation analog-to-digital converter still has the following drawbacks when operating at low power supply voltage:

1. Deterioration of conversion accuracy attributed to input interference and leakage currents under a low operation speed of the conventional successive approximation analog-to-digital converter cannot be effectively solved.

2. When the power supply voltage is decreased, some circuits of the conventional successive approximation analog-to-digital converter may fail to perform appropriately, and the conventional successive approximation analog-to-digital converter may fail to complete conversion within a predetermined time period.

3. The control logic of the conventional successive approximation analog-to-digital is rather complex.

SUMMARY OF THE INVENTION

Therefore, the object of the present invention is to provide a successive approximation analog-to-digital converter that can overcome the aforesaid problems associated with the prior art.

According to this invention, a successive approximation analog-to-digital converter comprises a switch module, a conversion module, a comparator and a control module.

The switch module is adapted to receive first and second input voltages, and is operable between an ON state and an OFF state in response to a switch control input. The switch module permits transmission of the first and second input voltages therethrough when operating in the ON state.

The conversion module is coupled to the switch module for receiving the first and second input voltages therefrom and further receiving a conversion control input. The conversion module is operable to output first and second comparison voltages that are respectively identical to the first and second input voltages when the switch module is in the ON state and to output the first and second comparison voltages based on the conversion control input when the switch module is in the OFF state.

The comparator is coupled to the conversion module for receiving the first and second comparison voltages therefrom, and is operable to compare the first and second comparison voltages so as to generate a comparison signal.

The control module is coupled to the switch module, the conversion module and the comparator, is adapted to receive the comparison signal from the comparator, and is further adapted to receive a clock signal. The control module is operable to generate the switch control input based on the clock signal so as to output the switch control input to the switch module. The control module is operable to generate a conversion output based on the comparison signal. The control module is operable to generate the conversion control input based on the clock signal and the conversion output and to output the conversion control input to the conversion module such that, when the switch module is in the OFF state, the conversion module raises and successively brings the first and second comparison voltages to approximate a reference voltage in response to the conversion control input. The control module is operable to generate, based on the conversion output and the comparison signal, a digital output corresponding to a difference between the first and second input voltages.

The switch module includes first and second switch units. Each of the first and second switch units includes a series connection of first and second switches, and a third switch. The first switch of each of the first and second switch units is adapted to receive a respective one of the first and second input voltages. The second switch of each of the first and second switch units is coupled to the conversion module. The third switch of each of the first and second switch units is coupled to a common node between the first and second switches of a corresponding one of the first and second switch unit, and receives the reference voltage. When the switch module is in the ON state, in each of the first and second switch units, the first and second switches conduct and the third switch is non-conducting, such that the respective one of the first and second input voltages is transmitted to the conversion module through the first and second switches. When the switch module is in the OFF state, in each of the first and second switch units, the first and second switches are non-conducting and the third switch conducts, such that the reference voltage is transmitted to the common node between the first and second switches through the third switch.

BRIEF DESCRIPTION OF THE DRAWINGS

Other features and advantages of the present invention will become apparent in the following detailed description of the preferred embodiment of this invention, with reference to the accompanying drawings, in which.

DETAILED DESCRIPTION OF THE PREFERRED EMBODIMENT

Figure 1:
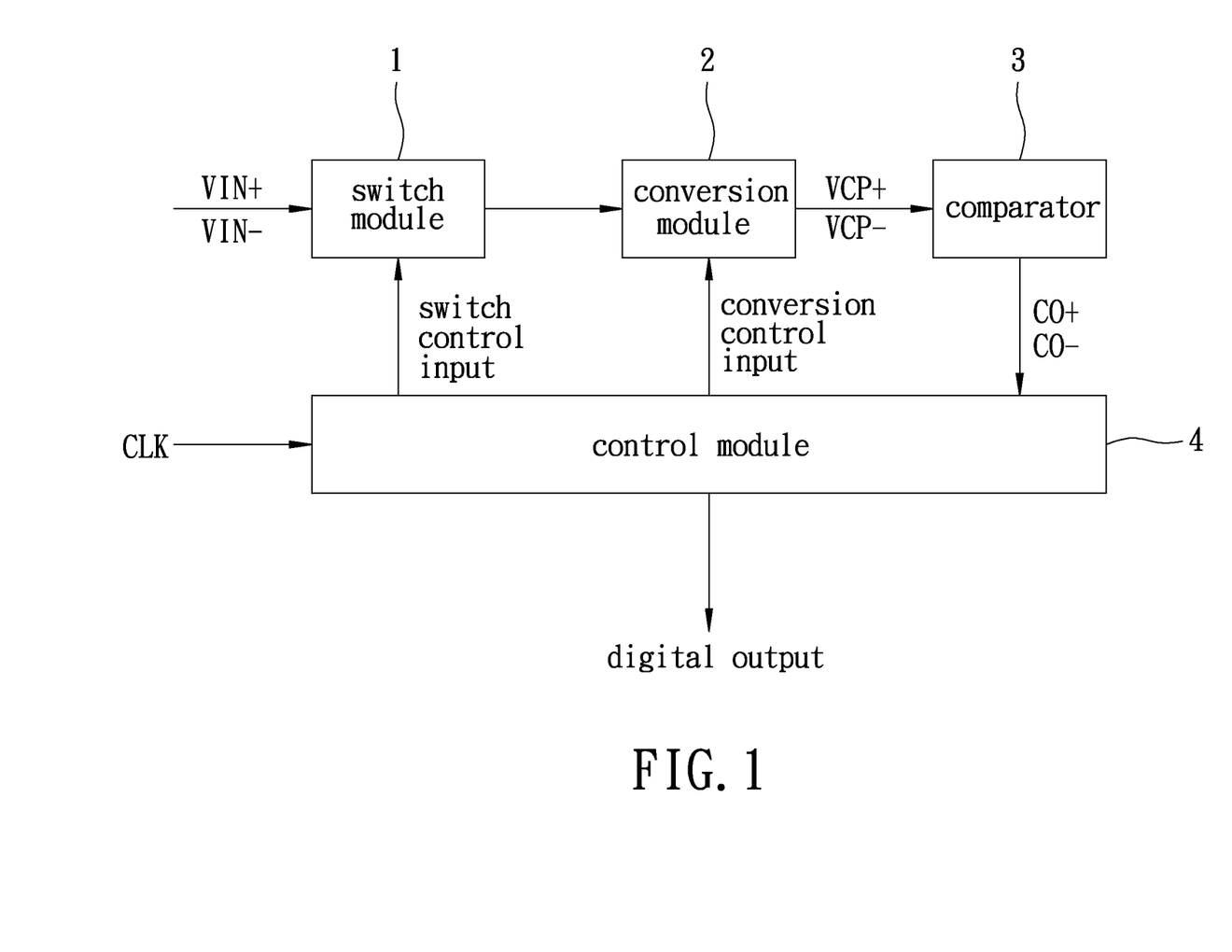
FIG. 1 is a schematic block diagram illustrating the preferred embodiment of a successive approximation analog-to-digital converter according to this invention.

Referring to FIG. 1, the preferred embodiment of a successive approximation analog-to-digital converter according to this invention includes a switch module 1, a conversion module 2, a comparator 3 and a control module 4.

The switch module 1 is adapted to receive first and second input voltages (VIN+, VIN−), and is operable between an ON state and an OFF state in response to a switch control input. The switch module 1 permits transmission of the first and second input voltages (VIN+, VIN−) therethrough when operating in the ON state.

The conversion module 2 is coupled to the switch module 1, receives the first and second input voltages (VIN+, VIN−) from the switch module 1, and further receives a conversion control input. The conversion module 2 is operable to output first and second comparison voltages (VCP+, VCP−) that are respectively identical to the first and second input voltages (VIN+, VIN−) when the switch module 1 is in the ON state and to output first and second comparison voltages (VCP+, VCP−) in response to the conversion control input when the switch module 1 is in the OFF state.

The comparator 3 is coupled to the conversion module 2 for receiving the first and second comparison voltages (VCP+, VCP−) therefrom, and is operable to compare the first and second comparison voltages (VCP+, VCP−) so as to generate first and second comparison signals (CO+, CO−).

The control module 4 is coupled to the switch module 1, the conversion module 2 and the comparator 3, and receives the first and second comparison signals (CO+, CO−) from the comparator 3, and a clock signal (CLK). The control module 4 is operable to generate the switch control input based on the clock signal (CLK), and to output the switch control input to the switch module 1. The control module 4 is operable to generate a conversion output based on the first and second comparison signals (CO+, CO−). The control module 4 is operable to generate the conversion control input based on the clock signal (CLK) and the conversion output, and to output the conversion control input to the conversion module 2, such that, when the switch module 1 is in the OFF state, the conversion module 2 raises and successively brings the first and second comparison voltages (VCP+, VCP−) to approximate a first reference voltage (VREFP) (see FIG. 2) in response to the conversion control input. The control module 4 is operable to generate, based on the conversion output and the first comparison signal (Co+), a digital output corresponding to a difference between the first and second input voltages (VIN+, VIN−).

This embodiment is described in detail below in an exemplary scenario in which the digital output includes, but not limited to, eleven bit signals (BIT(10:0)) in a form of an 11-bit code.

Figure 2:
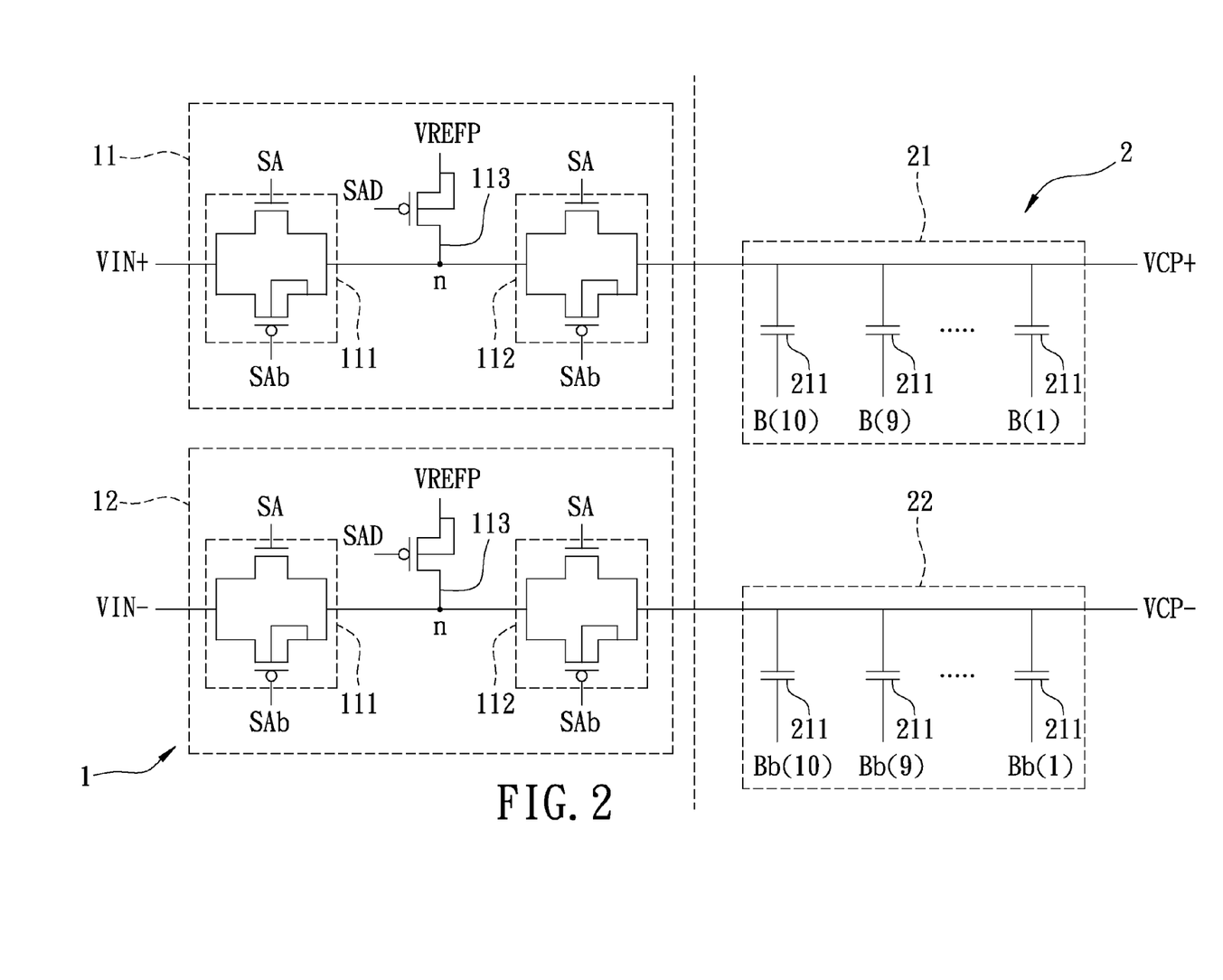
FIG. 2 is a schematic circuit diagram illustrating a switch module and a conversion module of the preferred embodiment.

Referring to FIG. 2, in this embodiment, the switch module 1 includes first and second switch units 11, 12. Each of the first and second switch units 11, 12 includes a first switch 111 adapted to receive a respective one of the first and second voltages (VIN+, VIN−), a second switch 112 coupled between the first switch 111 and the conversion module 2, and a third switch 113 coupled to a common node (n) between the first and second switches 111, 112 and adapted to receive the first reference voltage (VREFP). In addition, each of the first and second switches 111, 112 is, but not limited to, a transmission gate, and the third switch 113 is, but not limited to, a P-channel metal oxide semiconductor field effect transistor. In this embodiment, the switch control input includes complementary first and second switch control signals (SA, SAb), and a third switch control signal (SAD). The first and third switch control signal (SA, SAD) are each in phase with the clock signal (CLK), and the second switch control signal (SAb) is anti-phase with the clock signal (CLK). For each of the first and second switch units 11, 12, each of the first and second switches 111, 112 receives the first and second switch control signals (SA, SAb) so as to conduct or not conduct in response to the first and second switch control signals (SA, SAb), and the third switch 113 receives the third switch control signal (SAD) so as to conduct or not conduct in response to the third control signal (SAD). When the clock signal (CLK) is at a logic high level "1", the first and second switches 111, 112 of each of the first and second switch units 11, 12 conduct and the third switch 113 of each of the first and second switch units 11, 12 does not conduct, i.e., the switch module 1 is in the ON state. When the clock signal (CLK) is at a logic low level "0", the first and second switches 111, 112 of each of the first and second switch units 11, 12 do not conduct and the third switch 113 of each of the first and second switch units 11, 12 conducts, i.e., the switch module 1 is in the OFF state. As a result, when the switch module 1 is in the ON state, for each of the first and second switch units 11, 12, the respective one of the first and second input voltages (VIN+, VIN−) is transmitted to the conversion module 2 through the first and second switches 111, 112. When the switch module 1 is in the OFF state, for each of the first and second switch units 11, 12, the first reference voltage (VREFP) is transmitted to the common node (n) through the third switch 113.

Referring again to FIG. 2, in this embodiment, the conversion module 2 includes first and second capacitor arrays 21, 22. The conversion control input includes ten first conversion control signals (B(10:1)) and ten second conversion control signals (Bb(10:1)). The first capacitor array 21 includes ten capacitors 211 each having a first terminal coupled to the second switch 112 of the first switch unit 11 of the switch module 1, and a second terminal for receiving a respective one of the first conversion control signals (B(10:1)). The first terminals of the capacitors 211 of the first capacitor array 21 are coupled together to output the first comparison voltage (VCP+). Similar to the first capacitor array 21, the second capacitor array 22 includes ten capacitors 211 each having a first terminal coupled to the second switch 112 of the second switch unit 12 of the switch module 1, and a second terminal for receiving a respective one of the second conversion control signals (Bb(10:1)). The first terminals of the capacitors 211 of the second capacitor array 22 are coupled together to output the second comparison voltage (VCP−).

When the switch module 1 is in the ON state, the first and second input voltages (VIN+, VIN−) are transmitted to the conversion module 2 to charge/discharge the first and second capacitor arrays 21, 22, respectively. As a result, the first and second comparison voltages (VCP+, VCP−) are identical to the first and second input voltages (VIN+, VIN−), respectively. When the switch module 1 is in the OFF state, the first and second input voltages (VIN+, VIN−) are not transmitted to the conversion module 2. In this case, the first comparison voltage (VCP+) changes with the first conversion control signals (B(10:1)), and the second comparison voltage (VCP−) changes with the second conversion control signals (Bb(10:1)).

It is noted that capacitances of the capacitors 211 of each of the first and second capacitor arrays 21, 22 can be weighted in binary to form a geometric sequence with a common ratio of 2. Alternatively, they can be non-binary weighted to form a geometric sequence with a common ratio other than 2 or a non-geometric sequence. For example, in this embodiment, a ratio of the capacitances of the capacitors 211 of each of the first and second capacitor arrays 21, 22 is 224:128:72:40:23:12:6:4:2:1.

Figure 3:
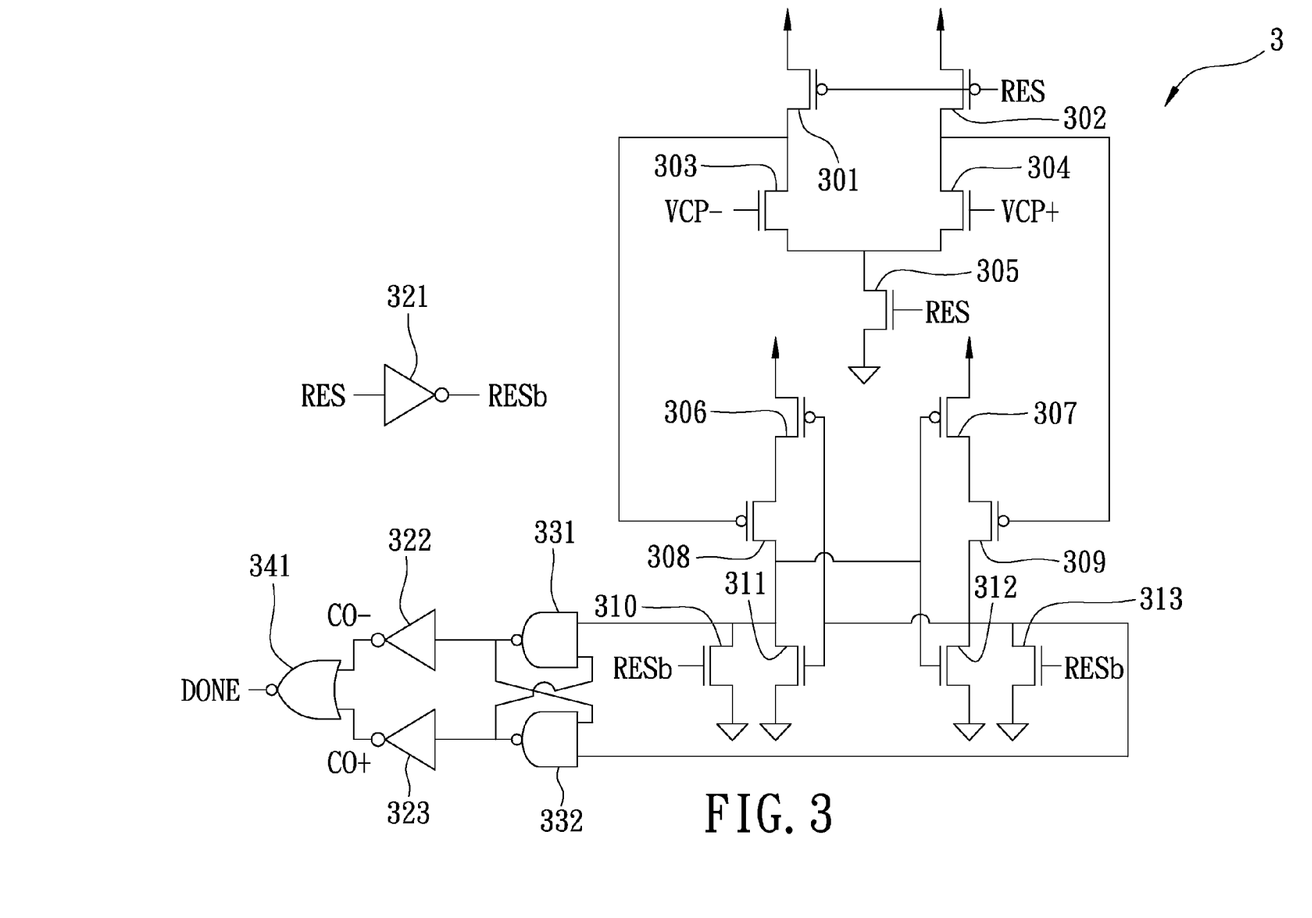
FIG. 3 is a schematic circuit diagram illustrating a comparator of the preferred embodiment.

Referring to FIG. 3, in this embodiment, the comparator 3 includes thirteen transistors 301 to 313, three inverters 321 to 323, two NAND gates 331, 332, and a NOR gate 341. The comparator 3 generates the first and second comparison signals (CO+, CO−) and a done signal (DONE) based on the first and second comparison voltages (VCP+, VCP−) and a reset signal (RES). The inverter 321 is configured to implement logical negation to the reset signal (RES) so as to output a NOT reset signal (RESb) with a logic level opposite to that of the reset signal (RES). When the reset signal (RES) is at a logic low level "0", the transistor 305 is non-conducting such that the first and second comparison voltages (VCP+, VCP−) are not compared, and the transistors 310, 313 conduct such that the first and second comparison signals (CO+, CO−) have the logic low level "0" due to logic operation of the NAND gates 331, 332 and the inverters 322, 323. Thus, the done signal (DONE) has a logic high level "1" due to logic operation of the NOR gate 341. When the reset signal (RES) becomes the logic high level "1", the transistor 305 becomes conducting so as to start comparison between the first and second comparison voltages (VCP+, VCP−), and the transistors 310, 313 become non-conducting such that one of the first and second comparison signals (CO+, CO−) becomes the logic high level "1" and the done signal (DONE) becomes the logic low level "0" to indicate completion of the comparison between the first and second comparison voltages (VCP+, VCP−). When it is determined that the first comparison voltage (VCP+) is not smaller than the second comparison voltage (VCP−), the first comparison signal (CO+) becomes the logic high level "1". When it is determined that the first comparison voltage (VCP+) is smaller than the second comparison voltage (VCP−), the second comparison signal (CO−) becomes the logic high level "1".

Figure 4:
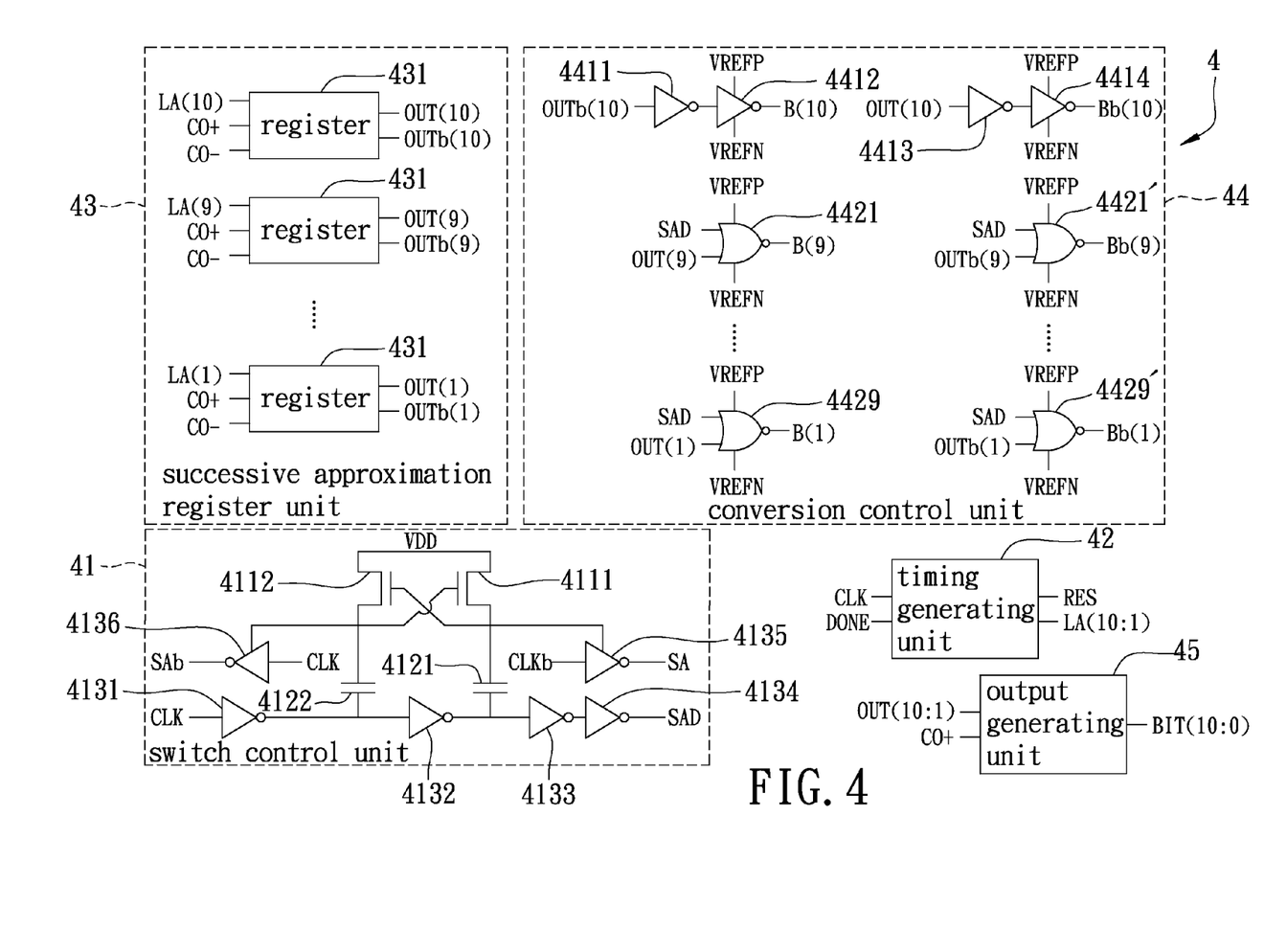
FIG. 4 is a schematic circuit diagram illustrating a control module of the preferred embodiment.

Referring further to FIGS. 2 and 4, in this embodiment, the control module 4 includes a switch control unit 41, a timing generating unit 42, a successive approximation register unit 43, a conversion control unit 44 and an output generating unit 45.

The switch control unit 41 generates the switch control input, i.e., the first, second and third switch control signals (SA, SAb, SAD) based on the clock signal (CLK). In this embodiment, the switch control unit 41 includes, but not limited to, two transistors 4111, 4112, two capacitors 4121, 4122 and six inverters 4131-4136. Due to the configuration of the switch control unit 41 shown in FIG. 4, the first and third switch control signals (SA, SAD) in phase with the clock signal (CLK), and the second switch control signal (SAb) anti-phase with the clock signal (CLK) are thus generated.

Since the switch control unit 41 uses charge pumping techniques to raise a value of a logic high level "1" of each of the first and second switch control signals (SA, SAb) to be higher than that of the third switch control signal (SAD), the first and second switches 111, 112 of each of the first and second switch units 11, 12 of the switch module 1 may easily conduct. More specifically, by virtue of the transistors 4111, 4112 and the capacitors 4121, 4122, the logic high level "1" of each of the first and second switch control signals (SA, SAb) has a value of twice a power supply voltage (VDD). The logic high level "1" of the third switch control signal (SAD) is equal to the power supply voltage (VDD).

The timing generating unit 42 generates the reset signal (RES) and ten latch control signals (LA(10:1) based on the clock signal (CLK) and the done signal (DONE), which is received from the comparator 3. When the clock signal (CLK) is at the logic low level "0", the timing generating unit 42 is operable to sequentially: (a) cause the reset signal (RES) to be at the logic low level "0", such that the comparator 3 does not compare the first and second comparison voltages (VCP+, VCP−) and such that the done signal (DONE) is at the logic high level "1"; (b) after a predetermined time period, cause the reset signal (RES) to become the logic high level "1", such that the comparator 3 starts the comparison between the first and second comparison voltages (VCP+, VCP−) and such that the done signal (DONE) becomes the logic low level "0" upon completion of the comparison; (c) after the done signal (DONE) becomes the logic low level "0", cause the reset signal (RES) to become the logic low level "0"; and (d) repeat the operations (b) and (c). The timing generating unit 42 causes each of the latch control signals (LA(10:1)) to be at a logic low level "0" when the clock signal (CLK) is at the logic high level "1", and causes one of the latch control signals (LA(10:1)) to become a logic high level "1" whenever the reset signal (RES) becomes the logic low level "0". It is noted that asynchronous timing control scheme is adopted in this embodiment.

Figure 5:
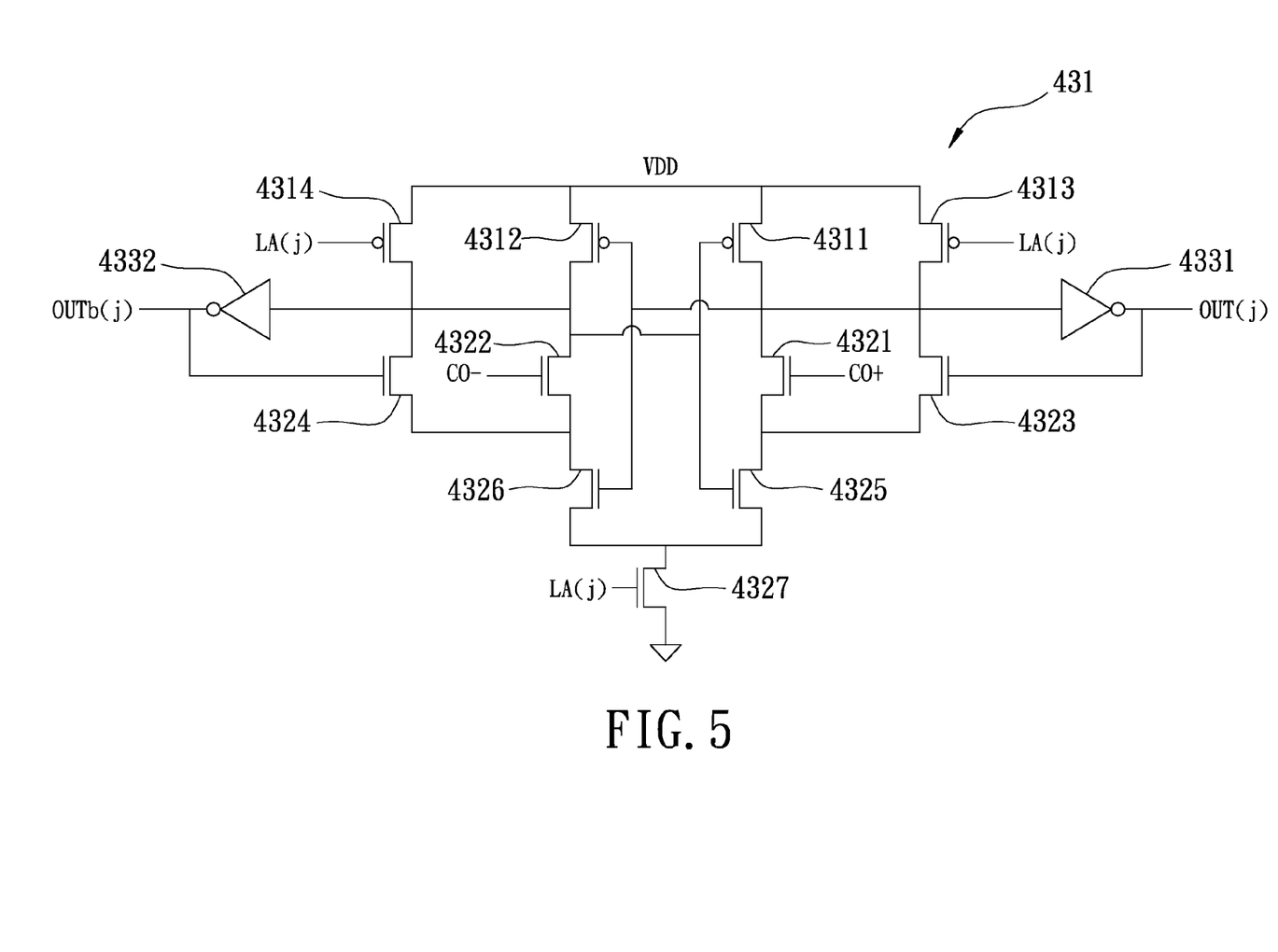
FIG. 5 is a schematic circuit diagram illustrating a register of a successive approximation register unit of the control module.

In this embodiment, as shown in FIG. 4, the successive approximation register unit 43 includes ten registers 431 for generating the conversion output based on the first and second comparison signals (CO+, CO−) from the comparator 3 and the latch control signals (LA(10:1)) from the timing generating unit 42. The conversion output includes ten first conversion output signals (OUT(10:1)) and ten second conversion output signals (OUTb(10:1)). Referring further to FIG. 5, each of the registers 431 includes first to fourth P-type transistors 4311 to 4314, first to seventh N-type transistors 4321 to 4327, and first and second inverters 4331, 4332.

For each register 431, the first P-type transistor 4311 has a first terminal adapted to receive the power supply voltage (VDD), a second terminal and a control terminal. The second P-type transistor 4312 has a first terminal coupled to the first terminal of the first P-type transistor 4311, a second terminal coupled to the control terminal of the first P-type transistor 4311, and a control terminal coupled to the second terminal of the first P-type transistor 4311. The third P-type transistor 4313 is coupled to the first P-type transistor 4311 in parallel, and has a control terminal for receiving a corresponding one of the latch control signals (LA(10:1)), i.e., LA(j), j=1, 2, . . . , 10. The fourth P-type transistor 4314 is coupled to the second P-type transistor 4312 in parallel, and has a control terminal coupled to the control terminal of the third P-type transistor 4313, i.e., receiving the same corresponding one of the latch control signals (LA(j)). The first N-type transistor 4321 has a first terminal coupled to the second terminal of the first P-type transistor 4311, a second terminal, and a control terminal for receiving the first comparison signal (CO+) from the comparator 3. The second N-type transistor 4322 has a first terminal coupled to the control terminal of the first P-type transistor 4311, a second terminal, and a control terminal for receiving the second comparison signal (CO−) from the comparator 3. The third N-type transistor 4323 is coupled to the first N-type transistor 4321 in parallel, and has a control terminal. The fourth N-type transistor 4324 is coupled to the second N-type transistor 4322 in parallel, and has a control terminal. The fifth N-type transistor 4325 has a first terminal coupled to the second terminal of the first N-type transistor 4321, a second terminal, and a control terminal coupled to the control terminal of the first P-type transistor 4311. The sixth N-type transistor 4326 has a first terminal coupled to the second terminal of the second N-type transistor 4322, a second terminal coupled to the second terminal of the fifth N-type transistor 4325, and a control terminal coupled to the second terminal of the first P-type transistor 4311. The seventh N-type transistor 4327 has a first terminal coupled to the second terminal of the fifth N-type transistor 4325, a grounded second terminal, and a control terminal coupled to the control terminal of the third P-type transistor 4313, i.e., receiving the same corresponding latch control signal (LA(j)). The first inverter 4331 has an input terminal coupled to the second terminal of the first P-type transistor 4311, and an output terminal coupled to the control terminal of the third N-type transistor 4323 and outputting a respective one of the first conversion output signals (OUT(10:1)), i.e., OUT(j), j=1, 2, . . . , 10. The second inverter 4332 has an input terminal coupled to the control terminal of the first P-type transistor 4311, and an output terminal coupled to the control terminal of the fourth N-type transistor 4324 and outputting a respective one of the second conversion output signals (OUTb(10:1)), i.e., OUTb(j), j=1, 2, . . . , 10.

In each of the registers 431, when the corresponding latch control signal (LA(j)) is at the logic low level "0", the seventh N-type transistor 4327 are non-conducting and the third and fourth P-type transistors 4313, 4314 conduct, such that the first and second comparison signals (CO+, CO−) are not latched. Thus, a respective first conversion output signal (OUT(j)) and a respective second conversion output signal (OUTb(j)) are at a logic low level "0". When the corresponding latch control signal (LA(j)) is at the logic high level "1", the seventh N-type transistor 4327 conducts and the third and fourth P-type transistors 4313, 4314 are non-conducting, such that the first and second comparison signals (CO+, CO−) are latched. Thus, the respective first conversion output signal (OUT(j)) becomes a logic high level "1" if the first and second comparison signals (CO+, CO−) are respectively at the logic high level "1" and the logic low level "0", and the respective second conversion output signal (OUTb(j)) becomes the logic high level "1" if the first and second comparison signals (CO+, CO−) are respectively at the logic low level "0" and the logic high level "1". Since only one of the latch control signals (LA(10:1)) becomes the logic high level "1" at a time, only a corresponding register 431 performs latching operation at a time.

As shown in FIG. 4, in this embodiment, the conversion control unit 44 includes four inverters 4411 to 4414, and eighteen NOR gates 4421 to 4429, 4421' to 4429' for generating the first conversion control signals (B(10:1)) and the second conversion control signals (Bb(10:1)) of the conversion control input based on the third switch control signal (SAD) from the switch control unit 41 and the first and second conversion output signals (OUT(10:1), OUTb(10:1)) of the conversion output from the successive approximation register unit 43.

In particular, the series connected inverters 4411, 4412 receive the second conversion output signal (OUTb(10)) to output the first conversion control signal (B(10)) that is in phase with the second conversion output signal (OUTb(10)). Similarly, the series connected inverters 4413, 4414 receive the first conversion output signal (OUT(10)) to output the second conversion control signal (Bb(10)) that is in phase with the first conversion output signal (OUT(10)). Each of the NOR gates 4421 to 4429 receives the third switch signal (SAD) and a respective one of the first conversion output signals (OUT(9:1)) to output a respective one of the first conversion control signals (B(9:1)). Each of the NOR gates 4421' to 4429' receives the third switch signal (SAD) and a respective one of the second conversion output signals (OUTb(9:1)) to output a respective one of the second conversion control signals (Bb(9:1)). Since the third switch control signal (SAD) is generated based on the clock signal (CLK), the output of each of the NOR gates 4421 to 4429 is essentially the result of a NOR operation of the clock signal (CLK) and a respective one of the first conversion output signals (OUT(9:1)), and the output of each of the NOR gates 4421' to 4429' is essentially the result of a NOR operation of the clock signal (CLK) and a respective one of the second conversion output signals (OUTb(9:1)).

Since the inverters 4412, 4414 and the NOR gates 4421 to 4429, 4421' to 4429' are powered by the first reference voltage (VREFP) and a second reference voltage (VREFN) smaller than the first reference voltage (VREFP), the value of the logic high level "1" of each of the first and second conversion control signals (B(10:1), Bb(10:1)) is identical to the first reference voltage (VREFP), and the value of the logic low level "0" of each of the first and second conversion control signals (B(10:1), Bb(10:1)) is identical to the second reference voltage (VREFN).

The output generating unit 45 generates the digital output, i.e, the bit signals (BIT(10:0)), based on the first conversion output signals (OUT(10:1)) from the successive approximation register unit 43 and the first comparison signal (CO+) from the comparator 3. In this embodiment, the bit signal (BIT(0)) is identical to the first comparison signal (CO+), and the bit signals (BIT(10:1)) are identical respectively to the first conversion output signals (OUT(10:1)). In other embodiments, the output generating unit 45 can calculate the digital output (BIT(10:0)) based on the first conversion output signals (OUT(10:1)) and the first comparison signal (CO+) according to the above example of the capacitances of the capacitors 211 of the conversion module 2, such that the digital output has a code value equal to a sum of 448×OUT(10), 256×OUT(9), 144×OUT(8), 80×OUT(7), 46×OUT(6), 24×OUT(5), 12×OUT(4), 8×OUT(3), 4×OUT(2), 2×OUT(1) and 1×(CO+) and ranging from 0 to 1025.

Referring to FIGS. 2 and 4, the successive approximation digital-to-analog converter of this embodiment is operable among a sampling phase and first to twelfth conversion phases. In an example of (VIN+)−(VIN−)=(278/512)VREF, where VREF=VREFP−VREFN, the following Table 1 details the sampling phase and the first to twelfth conversion phases.

TABLE 1

| Phase | OUT (10:1) | VCP+ | VCP− | (VCP+)−(VCP−) |
|---|---|---|---|---|
| Sampling phase CLK-1 LA(10:1) = 000H | All 0 | VIN+ | VIN− | $\frac{278}{512}$VREF |
| First conversion phase CLK = 0 LA(10:1) = 000H | All 0 | (VIN+) $+\frac{288}{512}$VREF | (VIN−) $+\frac{288}{512}$VREF | $\frac{278}{512}$VREF |

TABLE 1-continued

| Phase | OUT (10:1) | VCP+ | VCP− | (VCP+)−(VCP−) |
|---|---|---|---|---|
| Second conversion phase CLK = 0 LA(10:1) = 200H | OUT(10) = 1 The others unchanged | $(VIN+)$ $+\frac{288}{512}VREF$ | $(VIN-)$ $+\frac{512}{512}VREF$ | $\frac{54}{512}VREF$ |
| Third conversion phase CLK = 0 LA(10:1) = 300H | OUT(9) = 1 The others unchanged | $(VIN+)$ $+\frac{160}{512}VREF$ | $(VIN-)$ $+\frac{512}{512}VREF$ | $-\frac{74}{512}VREF$ |
| Fourth conversion phase CLK = 0 LA(10:1) = 380H | OUT(8) = 0 The others unchanged | $(VIN+)$ $+\frac{160}{512}VREF$ | $(VIN-)$ $+\frac{440}{512}VREF$ | $-\frac{2}{512}VREF$ |
| Fifth conversion phase CLK = 0 LA(10:1) = 3C0H | OUT(7) = 0 The others unchanged | $(VIN+)$ $+\frac{160}{512}VREF$ | $(VIN-)$ $+\frac{440}{512}VREF$ | $\frac{38}{512}VREF$ |
| Sixth conversion phase CLK = 0 LA(10:1) = 3E0H | OUT(6) = 1 The others unchanged | $(VIN+)$ $+\frac{137}{512}VREF$ | $(VIN-)$ $+\frac{400}{512}VREF$ | $\frac{15}{512}VREF$ |
| Seventh conversion phase CLK = 0 LA(10:1) = 3F0H | OUT(5) = 1 The others unchanged | $(VIN+)$ $+\frac{125}{512}VREF$ | $(VIN-)$ $+\frac{400}{512}VREF$ | $\frac{3}{512}VREF$ |
| Eighth conversion phase CLK = 0 LA(10:1) = 3F8H | OUT(4) = 1 The others unchanged | $(VIN+)$ $+\frac{119}{512}VREF$ | $(VIN-)$ $+\frac{400}{512}VREF$ | $-\frac{3}{512}VREF$ |
| Ninth conversion phase CLK = 0 LA(10:1) = 3FCH | OUT(3) = 0 The others unchanged | $(VIN+)$ $+\frac{119}{512}VREF$ | $(VIN-)$ $+\frac{396}{512}VREF$ | $\frac{1}{512}VREF$ |
| Tenth conversion phase CLK = 0 LA(10:1) = 3FEH | OUT(2) = 1 The others unchanged | $(VIN+)$ $+\frac{117}{512}VREF$ | $(VIN-)$ $+\frac{396}{512}VREF$ | $-\frac{1}{512}VREF$ |
| Eleventh conversion phase CLK = 0 LA(10:1) = 3FFH | OUT(1) = 0 The others unchanged | $(VIN+)$ $+\frac{117}{512}VREF$ | $(VIN-)$ $+\frac{395}{512}VREF$ | 0 |
| Twelfth conversion phase CLK = 0 LA(10:1) = 3FFH | All unchanged (CO+) = 1 | $(VIN+)$ $+\frac{117}{512}VREF$ | $(VIN-)$ $+\frac{395}{512}VREF$ | 0 |

In the sampling phase, the clock signal (CLK) is at the logic high level "1", and the latch control signals (LA(10:1)) are at the logic low level "0". Thus, the first conversion output signals (OUT(10:1)) are at the logic low level "0", the second conversion output signals (OUTb(10:1)) are at the logic low level "0", the first conversion control signals (B(10:1)) are at the logic low level "0", the second conversion control signals (Bb(10:1)) are at the logic low level "0", the first and second comparison voltages (VCP+, VCP−) are respectively identical to the first and second input voltages (VIN+, VIN−), and the difference between the first and second comparison voltages (VCP+, VCP−) is equal to (278/512)VREF.

In the first conversion phase, the clock signal (CLK) becomes the logic low level "0", and the latch control signals (LA(10:1)) are unchanged. Thus, the first conversion output signals (OUT(10:1)) are unchanged, the second conversion output signals (OUTb(10:1)) are unchanged, the first conversion control signals (B(9:1)) become the logic high level "1", the first conversion control signal (B(10)) is unchanged, the second conversion control signals (Bb(9:1)) become the logic high level "1", and the second conversion control signal (Bb(10)) is unchanged. As a result, the first and second comparison voltages (VCP+, VCP−) are respectively raised to (VIN+)+(288/512)*VREF and (VIN−)+(288/512)*VREF, the difference between the first and second comparison voltages (VCP+, VCP−) is equal to (278/512)*VREF, and the first and second comparison signals (CO+, CO−) are respectively at the logic high level "1" and the logic low level "0".

In the second conversion phase, the clock signal (CLK) is unchanged, the latch control signal (LA(10)) becomes the logic high level "1", and the latch control signals (LA(9:1)) are unchanged. Thus, the first conversion output signal (OUT(10)) becomes the logic high level "1", the first conversion output signals (OUT(9:1)) are unchanged, the second conversion output signals (OUTb(10:1)) are unchanged, the first conversion control signals (B(10:1)) are unchanged, the second conversion control signal (Bb(10)) becomes the logic high level "1", and the second conversion control signals (Bb(9:1)) are unchanged. As a result, the first comparison voltage (VCP+) is unchanged, the second comparison voltage (VCP−) becomes (VIN−)+(512/512)*VREF, the difference between the first and second comparison voltages (VCP+, VCP−) is equal to (54/512)*VREF, and the first and second comparison signals (CO+, CO−) are respectively at the logic high level "1" and the logic low level "0".

In the third conversion phase, the clock signal (CLK) is unchanged, the latch control signal (LA(9)) becomes the logic high level "1", and the latch control signals (LA(10), LA(8:1)) are unchanged. Thus, the first conversion output signal (OUT(9)) becomes the logic high level "1", the first conversion output signals (OUT(10), OUT(8:1)) are unchanged, the second conversion output signals (OUTb(10:1)) are unchanged, the first conversion control signal (B(9)) becomes the logic low level "0", the first conversion control signals (B(10), B(8:1)) are unchanged, and the second conversion control signals (Bb(10:1)) are unchanged. As a result, the first comparison voltage (VCP+) becomes (VIN+)+(160/512)*VREF, the second comparison voltage (VCP−) is unchanged, the difference between the first and second comparison voltages (VCP+, VCP−) is equal to −(74/512)*VREF, and the first and second comparison signals (CO+, CO−) are respectively at the logic low level "0" and the logic high level "1".

In the fourth conversion phase, the clock signal (CLK) is unchanged, the latch control signal (LA(8)) becomes the logic high level "1", and the latch control signals (LA(10:9), LA(7:1)) are unchanged. Thus, the first conversion output signals (OUT(10:1)) are unchanged, the second conversion output signal (OUTb(8)) becomes the logic high level "1", the second conversion output signals (OUTb(10:9), OUTb(7:1)) are unchanged, the first conversion control signals (B(10:1)) are unchanged, the second conversion control signal (Bb(8)) becomes the logic low level "0", and the second conversion control signals (Bb(10:9), Bb(7:1)) are unchanged. As a result, the first comparison voltage (VCP+) is unchanged, the second comparison voltage (VCP−) becomes (VIN−)+(440/512)*VREF, the difference between the first and second comparison voltages (VCP+, VCP−) is equal to −(2/512)*VREF, and the first and second comparison signals (CO+, CO−) are respectively at the logic low level "0" and the logic high level "1".

The operations in the fifth to tenth conversion phases can be known from those in the first to fourth conversion phases with reference to Table 1, details of the same are omitted herein for the sake of brevity.

In the eleventh conversion phase, the clock signal (CLK) is unchanged, the latch control signal (LA(1)) becomes the logic high level "1", and the latch control signals (LA(10:2)) are unchanged. Thus, the first conversion output signals (OUT(10:1)) are unchanged, the second conversion output signal (OUTb(1)) becomes the logic high level "1", the second conversion output signals (OUTb(10:2)) are unchanged, the first conversion control signals (B(10:1)) are unchanged, the second conversion control signal (Bb(1)) becomes the logic low level "0", and the second conversion control signals (Bb(10:2)) are unchanged. As a result, the first comparison voltage (VCP+) is unchanged, the second comparison voltage (VCP−) becomes (VIN−)+(395/512)*VREF, the difference between the first and second comparison voltages (VCP+, VCP−) is equal to 0, and the first and second comparison signals (CO+, CO−) are respectively at the logic high level "1" and the logic low level "0".

In the twelfth conversion phase, the clock signal (CLK) is unchanged, and the latch control signals (LA(10:1)) are unchanged. Thus, the first conversion output signals (OUT(10:1)) are unchanged, the second conversion output signals (OUTb(10:1)) are unchanged, the first conversion control signals (B(10:1)) are unchanged, the second conversion control signals (Bb(10:1)) are unchanged, the difference between the first and second comparison voltages (VCP+, VCP−) is equal to 0, and the first and second comparison signals (CO+, CO−) are respectively at the logic high level "1" and the logic low level "0". In this phase, the digital output, i.e., the bit signals (BIT(10:0)), in the form of the 11-bit code being 11001110101 is thus obtained.

In view of the above example, the successive approximation analog-to-digital converter of this embodiment has the following advantages:

1. In the first to twelfth conversion phases, since a potential at the common node (n) between the first and second switches 111, 112 of each of the first and second switch units 11, 12 of the switch module 1 is identical to the first reference voltage (VREFP), interference in each of the first and second comparison voltages (VCP+, VCP−) from variations of a respective one of the first and second input voltages (VIN+, VIN−) through capacitive coupling can be prevented. Moreover, as the conversion phases proceed, the first and second comparison voltages (VCP+, VCP−) approximate the first reference voltage (VREFP), such that a voltage across the second switch 112 of each of the first and second switch units 11, 12 of the switch module 1 approximates 0, thereby resulting in a decreased leakage current of the second switch 112, and decreased interference in the first and second comparison voltages (VCP+, VCP−).

2. Since the value of the logic high level "1" of each of the first and second switch control signals (SA, SAb) is raised, the first and second switches 111, 112 of each of the first and second switch units 11, 12 of the switch module 1 easily conduct in the sampling phase. Moreover, in the first to twelfth conversion phases, since a common mode level of the first and second comparison voltages (VCP+, VCP−) is greater than that of the first and second input voltages (VIN+, VIN−), the comparator 3 may have an enhanced operation speed.

3. Configuration of the control module 4 is relatively simple, thereby resulting in lower dynamic power dissipation.

While the present invention has been described in connection with what is considered the most practical and preferred embodiment, it is understood that this invention is not limited to the disclosed embodiment but is intended to cover various arrangements included within the spirit and scope of the broadest interpretation and equivalent arrangements.

What is claimed is:

1. A successive approximation analog-to-digital converter comprising:
a switch module adapted to receive first and second input voltages, and operable between an ON state and an OFF state in response to a switch control input, said switch module permitting transmission of the first and second input voltages therethrough when operating in the ON state;

a conversion module coupled to said switch module for receiving the first and second input voltages therefrom and further receiving a conversion control input, said conversion module being operable to output first and second comparison voltages that are respectively identical to the first and second input voltages when said switch module is in the ON state and to output the first and second comparison voltages based on the conversion control input when said switch module is in the OFF state;

a comparator coupled to said conversion module for receiving the first and second comparison voltages therefrom, and operable to compare the first and second comparison voltages so as to generate a first comparison signal; and a control module coupled to said switch module, said conversion module and said comparator, adapted to receive the first comparison signal from said comparator and further adapted to receive a clock signal, said control module being operable to sequentially generate the switch control input based on the clock signal and output the switch control input to said switch module, generate a conversion output based on the first comparison signal, generate the conversion control input based on the clock signal and the conversion output and output the conversion control input to said conversion module such that, when said switch module is in the OFF state, said conversion module raises and successively brings the first and second comparison voltages to approximate a first reference voltage in response to the conversion control input, and generate, based on the conversion output and the first comparison signal, a digital output corresponding to a difference between the first and second input voltages;

wherein said switch module includes first and second switch units, each of said first and second switch units including a series connection of first and second switches, said first switch being adapted to receive a respective one of the first and second input voltages, said second switch being coupled to said conversion module, and a third switch coupled to a common node between said first and second switches, and receiving the first reference voltage, wherein, when said switch module is in the ON state, in each of said first and second switch units, said first and second switches conduct and said third switch is non-conducting, such that the respective one of the first and second input voltages is transmitted to said conversion module through said first and second switches;

wherein, when said switch module is in the OFF state, in each of said first and second switch units, said first and second switches are non-conducting and said third switch conducts, such that the first reference voltage is transmitted to said common node between said first and second switches through said third switch.

2. The successive approximation analog-to-digital converter of claim 1, wherein:

said comparator is operable to further generate a second comparison signal based on comparison between the first and second comparison voltages;

the conversion output includes a plurality of first conversion output signals and a plurality of second conversion output signals; and said control module includes a plurality of registers, each of said registers including a first P-type transistor having a first terminal adapted to receive a power supply voltage, a second terminal and a control terminal, a second P-type transistor having a first terminal coupled to said first terminal of said first P-type transistor, a second terminal coupled to said control terminal of said first P-type transistor, and a control terminal coupled to said second terminal of said first P-type transistor, a third P-type transistor coupled to said first P-type transistor in parallel, and having a control terminal, a fourth P-type transistor coupled to said second P-type transistor in parallel, and having a control terminal coupled to said control terminal of said third P-type transistor, a first N-type transistor having a first terminal coupled to said second terminal of said first P-type transistor, a second terminal, and a control terminal for receiving the first comparison signal from said comparator, a second N-type transistor having a first terminal coupled to said control terminal of said first P-type transistor, a second terminal, and a control terminal for receiving the second comparison signal from said comparator, a third N-type transistor coupled to said first N-type transistor in parallel, and having a control terminal, a fourth N-type transistor coupled to said second N-type transistor in parallel, and having a control terminal, a fifth N-type transistor having a first terminal coupled to said second terminal of said first N-type transistor, a second terminal, and a control terminal coupled to said control terminal of said first P-type transistor, a sixth N-type transistor having a first terminal coupled to said second terminal of said second N-type transistor, a second terminal coupled to said second terminal of said fifth N-type transistor, and a control terminal coupled to said second terminal of said first P-type transistor, a seventh N-type transistor having a first terminal coupled to said second terminal of said fifth N-type transistor, a second terminal coupled to ground, and a control terminal coupled to said control terminal of said third P-type transistor, a first inverter having an input terminal coupled to said second terminal of said first P-type transistor and an output terminal coupled to said control terminal of said third N-type transistor, and being configured to output a respective one of the first conversion output signals, and a second inverter having an input terminal coupled to said control terminal of said first P-type transistor and an output terminal coupled to said control terminal of said fourth N-type transistor, and being configured to output a respective one of the second conversion output signals.

3. The successive approximation analog-to-digital converter of claim 2, wherein:

the conversion control input includes a plurality of first conversion control signals and a plurality of second conversion control signals, each of the first and second conversion control signals having a voltage that switches between the first reference voltage and a second reference voltage;

said control module generates, based on one of the second conversion output signals, a respective one of the first conversion control signals that is in phase with said one of the second conversion output signals;

said control module generates, based on one of the first conversion output signals, a respective one of the second conversion control signals that is in phase with said one of the first conversion output signals;

said control module generates each of remaining ones of the first conversion control signals based on the clock signal and a respective one of remaining ones of the first conversion output signals, each of the remaining ones of the first conversion control signals being in phase with a NOR operation of the clock signal and the respective one of the remaining ones of the first conversion output signals; and said control module generates each of remaining ones of the second conversion control signals based on the clock signal and a respective one of remaining ones of the second conversion output signals, each of the remaining ones of the second conversion control signals being in phase with a NOR operation of the clock signal and the respective one of the remaining ones of the second conversion output signals.

4. The successive approximation analog-to-digital converter of claim 1, wherein:

the switch control input includes first and second switch control signals for cooperatively controlling said first and second switches of each of said first and second switch units of said switch module, and a third switch control signal for controlling said third switch of each of said first and second switch units of said switch module, the second switch control signal being complementary to the first switch control signal, the third switch control signal being in phase with the first switch control signal, each of the first and second switch control signals having a logic high level whose value is greater than that of a logic high level the third switch control signal.

5. The successive approximation analog-to-digital converter of claim 1, wherein:

the conversion control input includes a plurality of first conversion control signals and a plurality of second conversion control signals; and said conversion module includes a first capacitor array coupled to said first switch unit of said switch module, and configured to receive the first conversion control signals and to output the first comparison voltage, and a second capacitor array coupled to said second switch unit of said switch module, and configured to receive the second conversion control signals and to output the second comparison voltage, each of said first and second capacitor arrays including a plurality of capacitors, each of which has a first terminal and a second terminal, said first terminals of said capacitors of said first capacitor array being coupled to each other for outputting the first comparison voltage, said second terminals of said capacitors of said first capacitor array respectively receiving the first conversion control signals, said first terminals of said capacitors of said second capacitor array being coupled to each other for outputting the second comparison voltage, said second terminals of said capacitors of said second capacitor array respectively receiving the second conversion control signals, capacitances of said capacitors of each of said first and second capacitor arrays are not a geometric sequence.

* * * * *